United States Patent [19]
Sumi et al.

[11] Patent Number: 5,776,830
[45] Date of Patent: Jul. 7, 1998

[54] PROCESS FOR FABRICATING CONNECTION STRUCTURES

[75] Inventors: Hirofumi Sumi; Keiichi Maeda; Yukiyasu Sugano; Kazuhide Koyama, all of Kanagawa; Mitsuru Taguchi, Tokyo; Kazuhiro Hoshino, Kanagawa, all of Japan

[73] Assignee: Sony Corporation, Tokyo, Japan

[21] Appl. No.: 947,704

[22] Filed: Oct. 9, 1997

Related U.S. Application Data

[63] Continuation of Ser. No. 654,755, May 29, 1996, abandoned, which is a continuation of Ser. No. 480,951, Jun. 7, 1995, abandoned, which is a continuation of Ser. No. 205,246, Mar. 3, 1994, abandoned.

[30] Foreign Application Priority Data

Mar. 5, 1993 [JP] Japan .................................. 5-070957

[51] Int. Cl.$^6$ .............................................. H01L 21/283
[52] U.S. Cl. ........................ 438/643; 438/648; 438/653; 438/655
[58] Field of Search ............................ 438/627, 643, 438/648, 653, 654, 655, 656, 664

[56] References Cited

U.S. PATENT DOCUMENTS 4,990,997  2/1991  Nishida .
5,236,869  8/1993  Takagi et al. ........................... 437/190
5,240,880  8/1993  Hindman et al. ....................... 437/190
5,312,772  5/1994  Yokoyama et al. ..................... 437/190
5,552,341  9/1996  Lee ........................................ 438/643
5,637,533  6/1997  Choi ...................................... 438/643
5,654,233  8/1997  Yu ......................................... 438/643

FOREIGN PATENT DOCUMENTS 2-274624   11/1987   Japan .
62-274624  11/1987   Japan .
3-185772    8/1991   Japan .

*Primary Examiner*—T. N. Quach
*Attorney, Agent, or Firm*—Hill & Simpson

[57] ABSTRACT

The present invention provides a process for fabricating a connection structure comprising a anti-reaction layer having excellent barrier properties and having improved ohmic characteristics with respect to the semiconductor substrate. Accordingly, the present invention comprises forming a first anti-reaction layer by temporarily ceasing the film deposition, and then initiating the film deposition again to form a second anti-reaction layer on the surface of the previously deposited first anti-reaction layer. A heat treatment can be applied to the structure after depositing a anti-reaction layer.

3 Claims, 8 Drawing Sheets related art

5,776,830

PROCESS FOR FABRICATING CONNECTION STRUCTURES

This is a continuation of application Ser. No. 08/654,755, filed May 29, 1996, abandoned, which is a continuation of application Ser. No. 08/480,951, filed Jun. 7, 1995, abandoned, which is a continuation of application Ser. No. 08/205,246, filed Mar. 3, 1994, abandoned.

BACKGROUND OF THE INVENTION

1. Field of the Invention

The present invention relates to a process for fabricating connection structures for use in semiconductor devices.

2. Prior Art

With the recent demand for higher integration of semiconductor devices, finer design rules and contact holes with even finer diameter are required. With decreasing diameter of the contact hole, however, it becomes more difficult to form a barrier metal as the anti-reaction layer inside the hole. As a result, a anti-reaction layer with poor coverage tend to be formed. Such a anti-reaction layer with poor coverage impairs the barrier properties inside the contact hole. Moreover, it is difficult with a prior art technique to form a buried-type connection metal layer, e.g., an aluminum-silicon layer, in the fine contact holes.

As a measure to overcome the aforementioned problems, a process for burying a contact hole using high temperature sputtering is proposed. More specifically, the proposed high temperature sputtering process comprises fluidizing the deposited aluminum-silicon film and introducing the melt inside the contact hole by heating the semiconductor substrate to a high temperature of 500° C. or higher during the deposition of the aluminum-silicon film. In this manner, a fine contact hole, as fine as such having a diameter of 0.1 µm, can be completely buried with a metal.

However, the high temperature sputtering process requires heating the semiconductor substrate to 500° C. or even higher during the deposition of the film. A heat treatment at such a high temperature destroys the anti-reaction layer provided as the base coating on the substrate, and generates aluminum spikes on the semiconductor substrate. This is a problem yet to be solved in this process.

Referring to FIG. 1, the problem above is described in further detail below. A conventional connection structure comprises a semiconductor substrate 1 having on the surface thereof an insulator layer 3 provided with a contact hole 2, and a anti-reaction layer 4 is formed inside the contact hole 2 inclusive of the bottom portion. An aluminum based metal deposition is formed as the connection 5 on the anti-reaction layer 4.

In the case of a connection structure obtained above, aluminum atoms diffuse from the connection 5 into the semiconductor substrate 1 through the anti-reaction layer 4 from the portions indicated with the arrows in the FIG. 1, i.e., the portions which are most thinly covered. Considering titanium nitride films deposited by sputtering, which are obtained as polycrystalline titanium nitride having a (111) crystallographic orientation, in particular, it is believed that the deterioration of the barrier properties occurs from the numerous grain boundaries (not shown in the figure) which exist between the crystallites.

High temperature sputtering requires the semiconductor substrate to be heated to a temperature of 500° C. or higher. However, since a favorable ohmic contact is achieved by forming, in general, an additional titanium film under the titanium nitride film which functions as the anti-reaction layer, titanium atoms from the titanium film undergo reaction with silicon atoms from the semiconductor substrate to form a titanium silicide at a temperature of about 500° C. The formation of a titanium silicide layer further impairs the barrier properties of the anti-reaction layer from the portions of poor coverage. When an aluminum-silicon film is deposited by high temperature sputtering, for instance, aluminum atoms intrude the anti-reaction layer from the portions of impaired barrier properties to react with the lower titanium layer or the titanium silicide layer. Then, silicon atoms in the lower semiconductor substrate are carried to the titanium layer, the silicide layer, and the aluminum-silicon layer, thereby resulting in the generation of aluminum spikes.

SUMMARY OF THE INVENTION

Thus, an object of the present invention is to provide a connection structure having excellent barrier properties and a process for fabricating the same.

The present invention provides, accordingly, a process for fabricating a connection structure to accomplish the aforementioned object.

More specifically, the present invention provides a process for fabricating a connection structure, which comprises forming a anti-reaction layer on a semiconductor substrate, followed by forming a connection being connected to the semiconductor substrate via the anti-reaction layer, characterized in that the formation of the anti-reaction layer is temporarily stopped during the film deposition to obtain a first anti-reaction layer, then initiating again the film deposition to form a second anti-reaction layer on the surface of the first anti-reaction layer.

The present invention also provides a process for fabricating a connection structure which comprises connecting a connection to a semiconductor substrate via a anti-reaction layer, characterized in that a heat treatment is performed after depositing the anti-reaction layer.

The aforementioned heat treatment is performed in an inert gas atmosphere containing oxygen mixed therein, or in air, in the temperature range of from 400° to 600° C.

In the process for fabricating the connection structure above, the first and the second anti-reaction layers in the first embodiment of the anti-reaction layer in the second embodiment can be deposited after depositing an ohmic layer on the surface of the semiconductor substrate.

The above process for fabricating a connection structure comprises forming a first anti-reaction layer by temporarily ceasing the deposition, and then initiating the film deposition again to form a second anti-reaction layer. In this manner, the grain boundaries in the second anti-reaction layer can be prevented from being formed linearly superposed on the grain boundaries which are formed also linearly in the first anti-reaction layer. Thus, when an aluminum connection is formed, aluminum atoms cannot penetrate the anti-reaction layer through the grain boundaries and be carried straightforward from the connection to the semiconductor substrate.

Otherwise, heat treatment can be applied to the structure after depositing the anti-reaction layer. Thus, oxygen atoms can be incorporated inside the grain boundaries in each of the anti-reaction layers and provide buried grain boundaries. In this manner, the penetration of aluminum atoms through the grain boundaries can be avoided.

Oxygen can be more easily incorporated in the grain boundaries by performing the heat treatment under an inert gas atmosphere containing oxygen, or in air. Furthermore, a heat treatment in the temperature range of from 400° to 600° C. allows oxygen atoms to be incorporated into the grain boundaries without considerably increasing the contact resistance.

In the process for fabricating the connection structure above, the ohmic characteristics of the structure can be further ameliorated by forming an ohmic layer on the surface of the semiconductor substrate, and then depositing the first and the second anti-reaction layers according to the first embodiment or the anti-reaction layer according to the second embodiment.

DETAILED DESCRIPTION OF THE PREFERRED EMBODIMENTS

Referring to FIGS. 2(A) to 2(E), a process according to the first embodiment of the present invention is described below.

Figure 1:
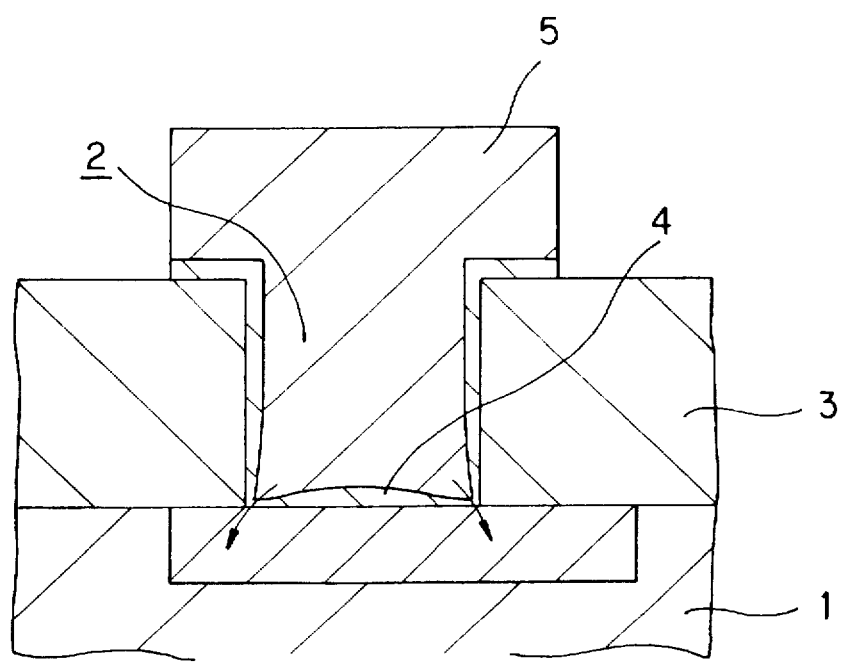
FIG. 1 shows schematically a prior art connection structure.
Figure 2A:
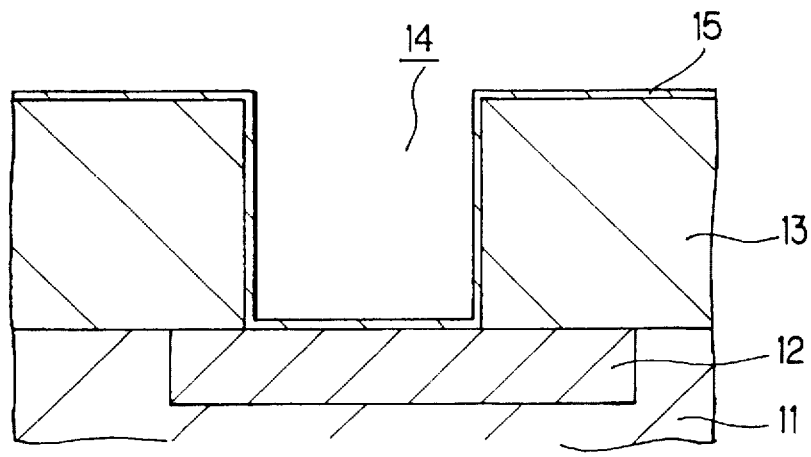
FIGS. 2(A) to 2(E) are each schematic partial cross section views of step-sequential structures showing the process steps of a process according to the first embodiment of the present invention.

Referring to FIG. 2(A), a diffusion layer 12 is formed on a semiconductor substrate 11, and an insulator layer 13 is deposited on the surface of the entire substrate inclusive of the diffusion layer. A contact hole 14 is provided in the insulator film 13 at a portion located just above the diffusion layer 12.

A titanium film 15 is then deposited by sputtering, for example, for a thickness of 30 nm, on the inner wall of the contact hole 14 inclusive of the bottom portion thereof and also on the upper surface of the insulator film 13. The film deposition by sputtering can be performed, for example, by flowing 100 sccm (standard cubic centimeters per minute) of argon (Ar) gas as the sputtering gas, controlling the pressure to, e.g., 0.47 Pa and the temperature to, e.g., 150° C., and setting the power to, e.g., 1 kW.

Figure 2B:
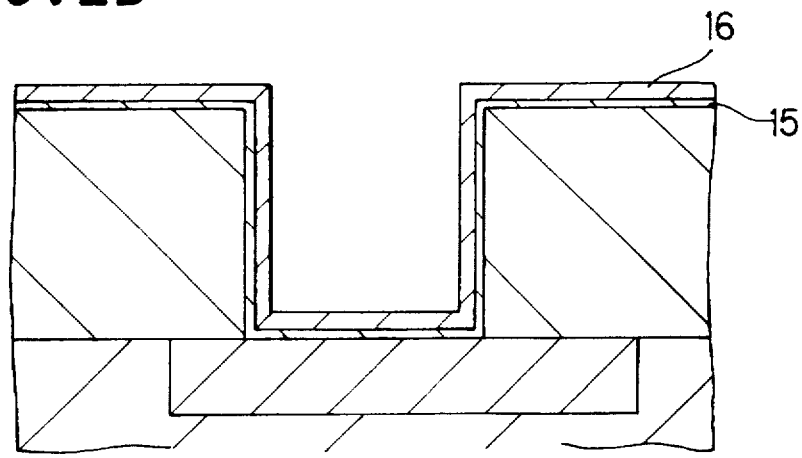

Referring to FIG. 2(B), a first reaction preventive film 16 is then deposited by sputtering to a thickness of, for example, 50 nm, on the surface of the titanium film 15. The anti-reaction layer, which may be a titanium nitride film, is deposited by, for example, using a mixed gas comprising argon (Ar) and nitrogen ($N_2$) gases, each flown at a rate of 40 sccm and 70 sccm, respectively, and applying a pressure of, e.g., 0.47 Pa and a power of, e.g., 5 kW.

The generation of plasma is then ceased.

Figure 2C:
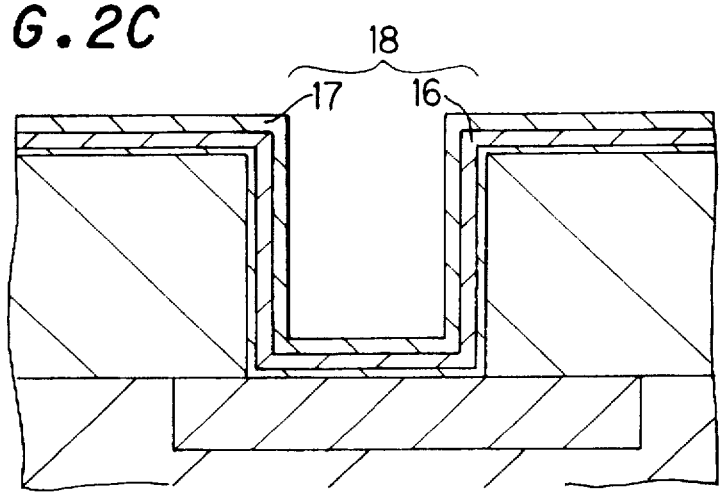

Referring to FIG. 2(C), a second reaction preventive film 17 is then deposited to a thickness of, for example, 50 nm, on the surface of the first reaction preventive film 16, under the conditions similar to those used in the deposition of the first reaction preventive film 16. The second reaction preventive film 17 also comprises titanium nitride in the same manner as in the case of the first reaction preventive film 16. In this manner, a anti-reaction layer 18 comprising a first and a second anti-reaction layer 16 and 17 is formed.

Then, the semiconductor substrate 11 having thereon the first and the second semiconductor films 16 and 17 is subjected to heat treatment. The heat treatment is performed, for example, for a duration of 30 minutes, while flowing, for instance, a mixed gas comprising nitrogen ($N_2$) and oxygen ($O_2$) gases each flown at a rate of 6 $dm^3$/min and 1.2 $dm^3$/min, respectively, and controlling the temperature of the atmosphere to, e.g., 500° C.

This heat treatment can be performed immediately after forming the first reaction preventive film 16.

Figure 2D:
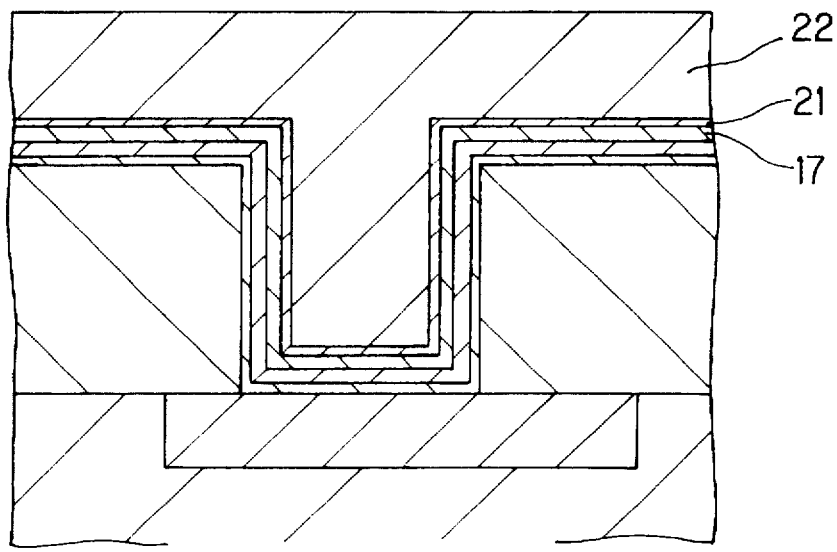

A connection is formed thereafter. Referring to FIG. 2(D), a titanium film 21 is deposited, for example, for a thickness of 30 nm by sputtering on the surface of the second anti-reaction layer 17. This film deposition can be performed under the same film deposition conditions as those employed in the film deposition described with reference to FIG. 2(A).

Subsequently, high temperature sputtering is conducted to bury the contact hole 14 and to deposit, for example, an aluminum alloy film (e.g., an aluminum-silicon film and an aluminum-silicon-copper film) 22, for a thickness of, for example, 500 nm, on the upper surface of the titanium film 21. The film deposition is performed, for example, using argon (Ar) gas flown at a rate of 40 sccm, while controlling the temperature and the pressure to, e.g., 500° C. and 0.47 Pa, respectively, and setting the power to, e.g., 22.5 kW.

Figure 2E:
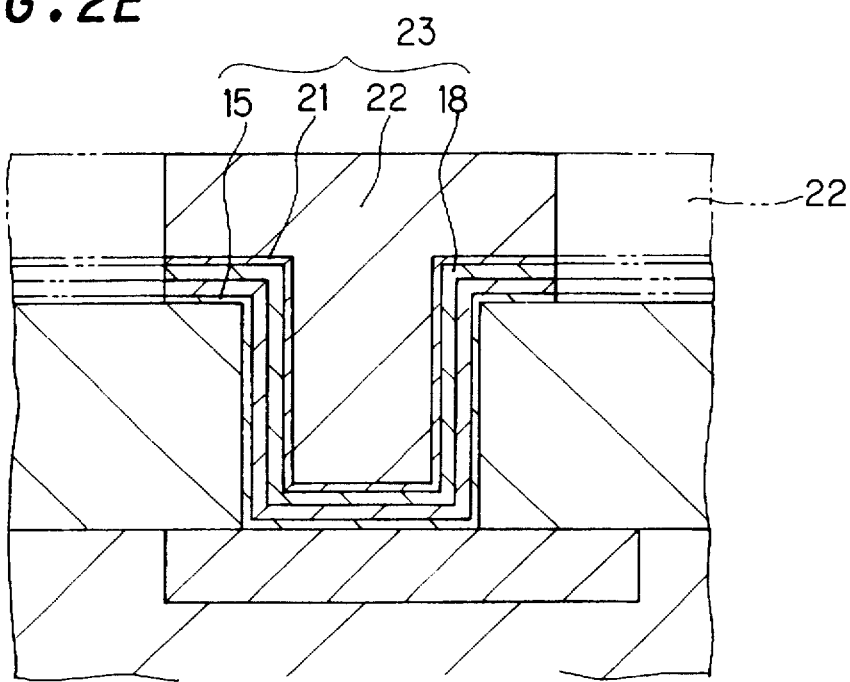

Referring to FIG. 2(E), the portions indicated with line-dot-dot in the aluminum alloy film 22, the titanium film 21, the reaction preventive film 18, and the titanium film 15 are removed by ordinary technologies of photolithography and etching (e.g., dry etching), to provide a connection comprising the residual portions of the aluminum alloy film 22, the titanium film 21, the reaction preventive film 18, and the titanium film 15. The etching can be effected, for example, using a mixed gas comprising boron trichloride ($BCl_3$) gas and chlorine ($Cl_2$) gas, each flown at a rate of 60 sccm and 90 sccm, respectively, while setting the atmospheric pressure, the microwave power, and the RF power to, e.g., 16 mPa, 1 kW, and 50 W, respectively.

Figure 3:
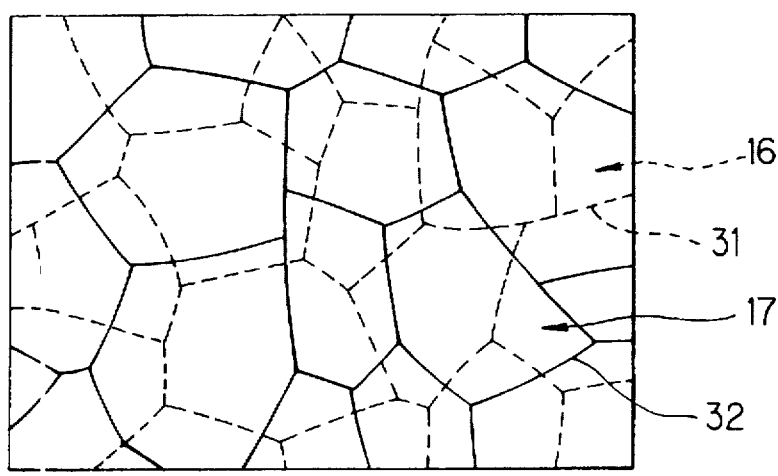
FIG. 3 is an explanatory drawing which shows schematically the grain boundaries of a anti-reaction layer.

In the first embodiment described above, the film deposition of the reaction preventive film 18 is temporarily ceased to form the first anti-reaction layer 16, and the film deposition is initiated again to form a second anti-reaction layer 17 on the surface of the first anti-reaction layer 16. Thus, referring to FIG. 3, when viewed from the upper side of the substrate 11, the grain boundaries 31 (shown with broken lines in the figure) of the anti-reaction layer 16 and those (shown with solid lines in the figure) of the anti-reaction layer 17 are formed principally in such a manner that they are be crossed, but less in such a manner that the grain boundaries in the upper layer are superposed on those of the lower.

Thus, by forming an aluminum based connection 23 according to the process steps illustrated in FIGS. 2(A) to 2(E), the penetration of aluminum atoms from the connection 23 to the semiconductor substrate through the grain boundaries 31 and 32 of the first and the second anti-reaction layers 16 and 17, respectively, can be substantially prevented.

The heat treatment can be performed, as described in the foregoing, either after forming the second anti-reaction layer 17 or after forming the first preventive layer 16. Otherwise, the heat treatment can be performed every time after forming the first anti-reaction layer 16 and the second anti-reaction layer 17.

The heat treatment is performed to bury either or both of the reaction boundaries in the first and the second anti-reaction layers with oxygen. Thus, the penetration of aluminum from the connection to the semiconductor substrate through the grain boundaries can be prevented.

The temperature of the heat treatment need not be confined to 500° C., but any temperature in the range of from 400° C. to 600° C. can be selected. Conclusively, the heat treatment can be performed at any temperature at which oxygen atoms can be incorporated into the grain boundaries of the anti-reaction layer to bury the grain boundaries.

Figure 4:
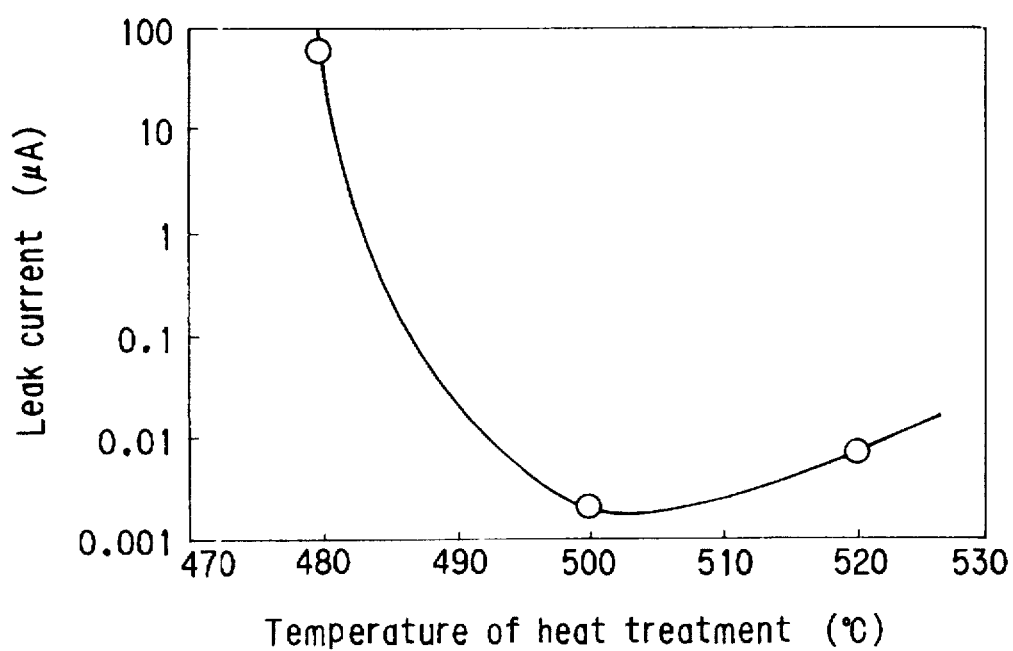
FIG. 4 is a graph showing a relation between a leak current measured on the structure and the temperature of heat treatment applied to the structure.

According to FIG. 4 which shows the relation between the leak current and the temperature of the heat treatment, with minimum leak current being obtained at a temperature of 500° C., the heat treatment in the first embodiment is performed at 500° C. Leak current attributed to the presence of junctions can be minimized by conducting the heat treatment at this temperature. Needless to say, the ordinate and the abscissa of the graph shown in FIG. 4 each represent the leak current and the temperature of the heat treatment, respectively.

The heat treatment need not be performed under a mixed gas atmosphere comprising oxygen and nitrogen. For instance, an inert gas atmosphere containing oxygen, or air may be employed as well, though dry air is preferred when the heat treatment is performed in air.

Figure 5:
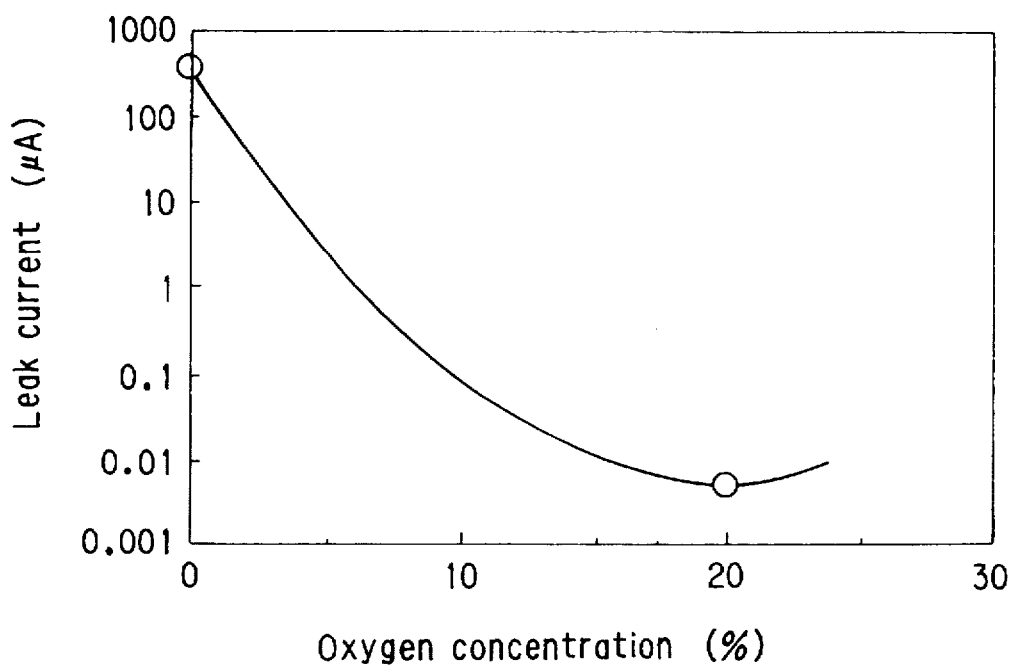
FIG. 5 is a graph showing a relation between a leak current measured on the structure and the oxygen concentration of the atmosphere under which heat treatment is applied to the structure.

Referring to FIG. 5, the relation between the leak current and the oxygen concentration of the atmosphere used in the heat treatment is explained. The ordinate and the abscissa of the graph each represent the leak current and the oxygen concentration, respectively. The oxygen concentration as referred herein corresponds to the fraction of oxygen in the entire gas mixture comprising nitrogen and oxygen. As shown in FIG. 5, a minimum leak current is obtained for an oxygen concentration of about 20%. Thus, the junction leak can be minimized by heat treating the structure under an atmosphere containing oxygen at a concentration of 20%.

In the first embodiment of the present invention, the natural oxide film (not shown in the figure) which is present on the surface of the semiconductor substrate 11 is reduced by depositing the titanium film 15. Thus, a titanium film must be deposited at least for a thickness corresponding to that of a monolayer. Accordingly, a titanium film is deposited for a thickness of at least 0.05 nm.

Favorable ohmic characteristics can be thereby established between the semiconductor substrate 11 and the anti-reaction layer 18 in this manner by forming a titanium film 15.

The process according to a second embodiment of the present invention is explained below.

Figure 6A:
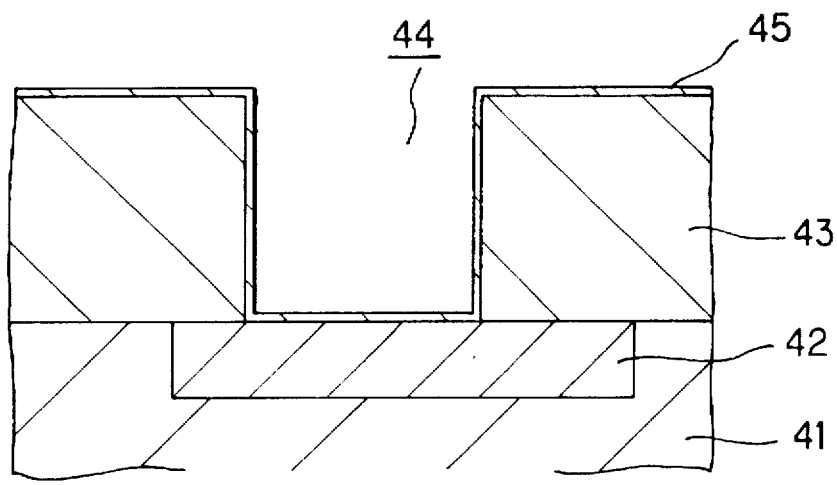
FIGS. 6(A) to 6(C) are each schematic partial cross section views of step-sequential structures showing the process steps of a process according to the second embodiment of the present invention.
Figure 6B:
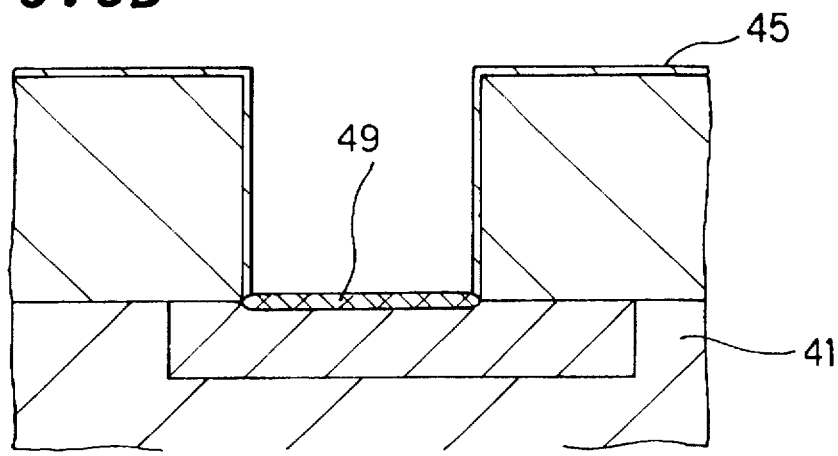
Figure 6C:
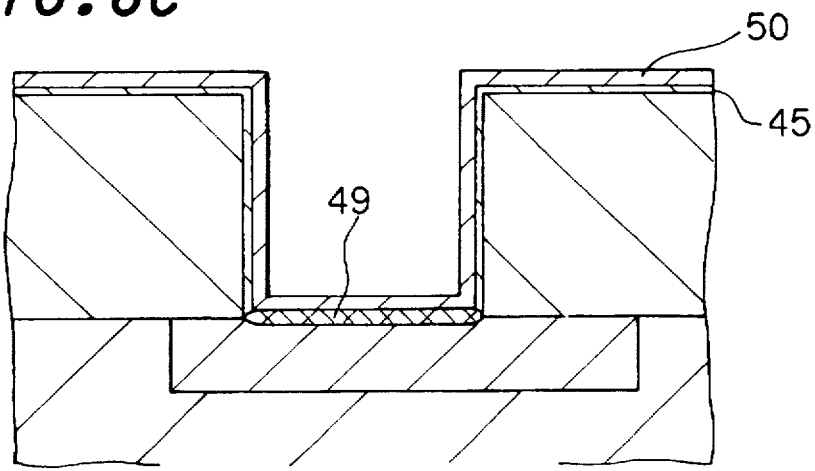

Referring to FIGS. 6(A) to 6(C), the step-sequential process for fabricating a silicide layer as the ohmic layer on the surface of a semiconductor substrate 41 is described.

As shown in FIG. 6(A), a diffusion layer 42 is formed on the upper layer of a semiconductor substrate 11 made of, for example, a single crystal silicon, and an insulator film 43 is deposited on the entire upper surface of the semiconductor substrate 41. The insulator film 43 is made of, for example, a silicon oxide-based material. A contact hole 44 is provided in the insulator film 43 at a portion located just over the diffusion layer 42.

A titanium film 45 is then deposited by sputtering, for example, for a thickness of 10 nm, on the inner wall of the contact hole 44 inclusive of the bottom portion thereof, and on the upper surface of the insulator film 43. The film deposition by sputtering can be performed, for example, under the same conditions as those employed in deposition step described with reference to FIG. 2(A).

Referring to FIG. 6(B), heat treatment is performed to form a silicide layer. In this case, titanium atoms of the titanium film 45 in contact with the semiconductor substrate 41 are allowed to react with silicon atoms of the semiconductor substrate 41 to form a titanium silicide ($TiSi_2$) layer 49 which functions as an ohmic layer. Thus, the portion of the titanium film 45 not in contact with the semiconductor substrate 41 remains as it is without forming any silicide. The heat treatment for forming silicide is performed using a rapid thermal annealing (RTA) apparatus for a duration of, for example, 30 seconds, while setting the temperature of the heat treatment at 600° C. and under a nitrogen ($N_2$) gas flow of 5 $dm^3$/min.

In a similar manner as described with reference to FIG. 2(B) of the first embodiment above, a reaction preventive film 50 is deposited, for example, to a thickness of 50 nm on the surfaces of the titanium film 45 and the titanium silicide layer 49 (see FIG. 6(C)). Then, as described with reference to FIG. 2(D) in the first embodiment, the structure is subjected to heat treatment to incorporate oxygen atoms into the grain boundaries of the reaction preventive film 50.

In the subsequent step, though not illustrated in the figure, connection is formed in the same manner as in the process described with reference to FIG. 2 according to an ordinary process for forming a connection.

In the second embodiment, the titanium film 45 is deposited for a thickness of 10 nm to form the titanium silicide layer 40. However, the thickness of the titanium film 45 is not limited thereto, and the titanium film 45 may be deposited to a thickness as desired so long as the titanium film 45 in contact with the semiconductor substrate can be entirely converted into a titanium silicide film. Thus, the titanium film 45 is deposited to an optimum film thickness which provides the minimum junction leak.

Figure 7:
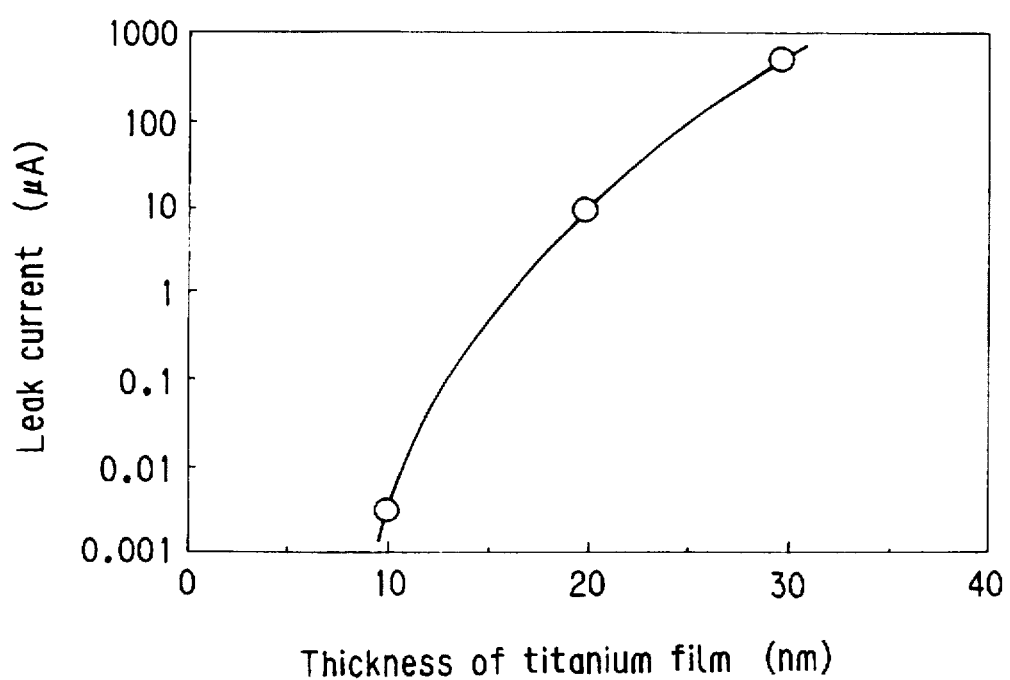
FIG. 7 is a graph showing a relation between a leak current measured on the structure and the thickness of the titanium film.

FIG. 7 is a graph showing the relation between a leak current and the film thickness of a titanium film. The ordinate and the abscissa of the graph each represent the leak current and the titanium film thickness, respectively. The leak current in titanium films tends to decrease with decreasing thickness, and with titanium films 30 nm or less in thickness, the junction leak can be sufficiently lowered.

In the second embodiment according to the present invention, the heat treatment is applied to the structure after depositing the anti-reaction layer 50 to incorporate oxygen into the grain boundaries of the anti-reaction layer 50. Since the grain boundaries are buried by oxygen, the penetration of aluminum atoms from the connection to the semiconductor substrate through the grain boundaries can be prevented from occurring.

Furthermore, the ohmic characteristics can be ameliorated by forming a titanium silicide layer 49 as the ohmic layer on the surface of the semiconductor substrate 41.

A third embodiment according to the present invention is explained below.

Referring to FIG. 8, process steps for fabricating a SALICIDE layer as the ohmic layer on the surface of a semiconductor substrate 11 is described below.

Figure 8A:
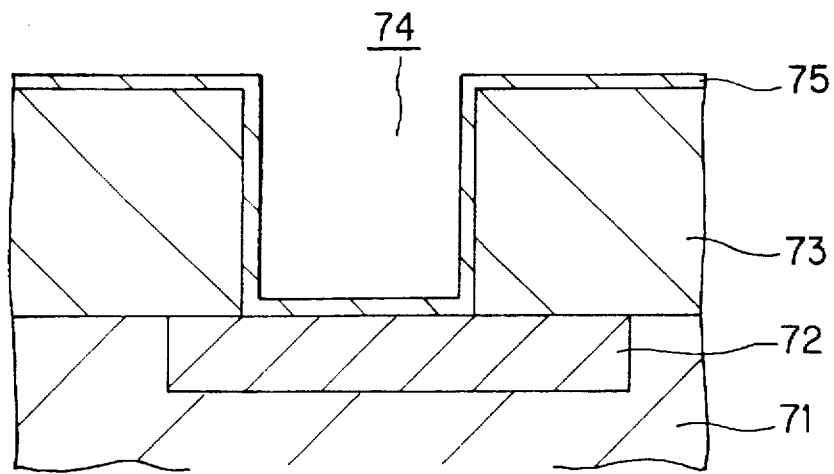
FIGS. 8(A) to 8(C) are each schematic partial cross section views of step-sequential structures showing the process steps of a process according to the third embodiment of the present invention.

Referring to FIG. 8(A), a diffusion layer 72 is formed on the upper layer of a semiconductor substrate 71 made of, for example, a single crystal silicon, and an insulator film 73 is deposited on the entire surface of the semiconductor substrate 71. The insulator film 73 is made of, for example, a silicon oxide-based material. A contact hole 74 is provided in the insulator film 73 at a portion located just over the diffusion layer 72.

A titanium film 75 is then deposited by sputtering, for example, for a thickness of 30 nm, on the inner wall of the contact hole 74 inclusive of the bottom portion thereof, and on the upper surface of the insulator film 73. The film deposition by sputtering can be performed, for example, under the same conditions as those employed in deposition step described with reference to FIG. 2(A).

Figure 8B:
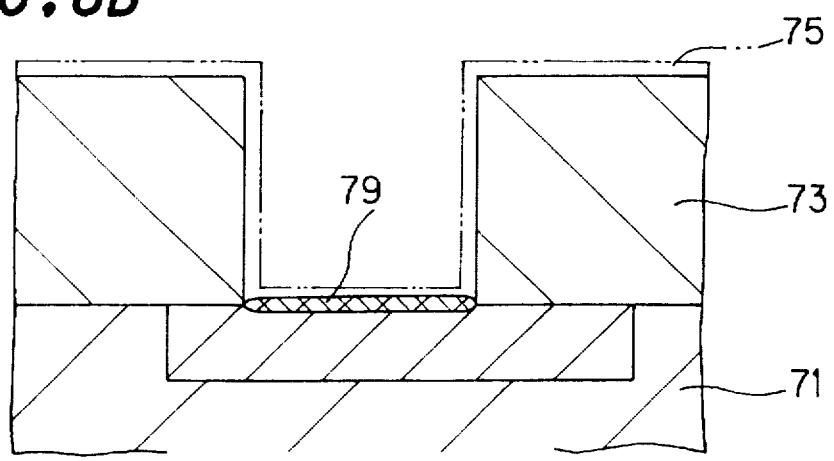

Referring to FIG. 8(B), heat treatment is performed to form a SALICIDE layer. In this case, titanium atoms of the titanium film 75 in contact with the semiconductor substrate 71 are allowed to react with silicon atoms of the semiconductor substrate 71 to form a titanium silicide layer 79. Thus, the portion of the titanium film 75 not in contact with the semiconductor substrate 71 remains as it is without forming any silicide. The heat treatment for forming silicide is performed using a rapid thermal annealing (RTA) apparatus under the same conditions employed in the foregoing embodiment in the step accompanied with FIG. 6(A).

Then, the titanium film 75 (indicated with line-dot-dot curves) which remains unreacted on the surface and the like of the insulator film 73 is removed. This titanium film 75 can be removed, for instance, by wet etching, which comprises dipping the structure into an aqueous ammonia solution for a duration of, e.g., 10 minutes.

The resulting structure is then subjected to heat treatment again. The heat treatment can be performed using a rapid thermal annealing (RTA) apparatus for a duration of, for example, 30 seconds, while setting the temperature of the heat treatment at 800° C. and flowing, for example, nitrogen ($N_2$) gas at a rate of 5 $dm^3$/min. The titanium silicide layer 79 can be stabilized in this manner.

Figure 8C:
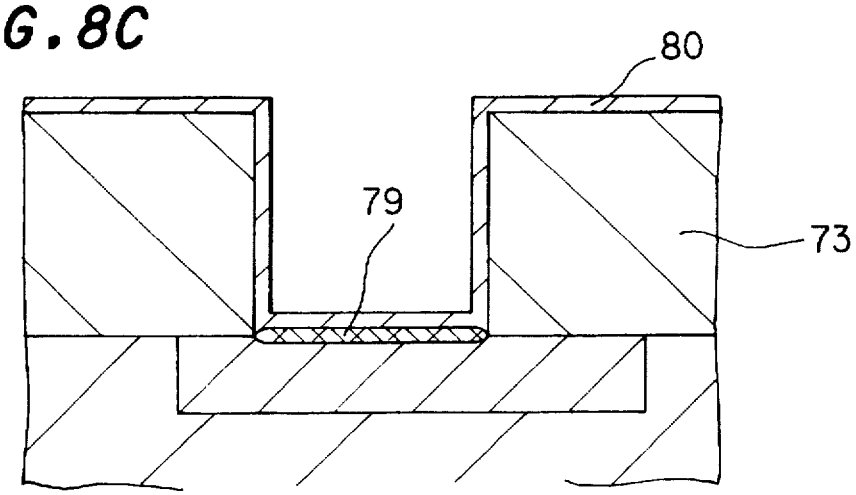

Referring to FIG. 8(C), a reaction preventive film 80 is deposited on each of the surfaces of the insulator film 72 and the titanium silicide layer 79, in the same manner as that explained in the first embodiment above with reference to FIG. 2(B). Then, also in the same manner as in the step referring to FIG. 2(D), a heat treatment is conducted to incorporate oxygen atoms inside the grain boundaries of the anti-reaction layer 80.

Though not shown in the figure, a connection is formed according to an ordinary process. For details, reference can be made to the description above in conjunction with FIGS. 2(A) to 2(C).

In the third embodiment described in the foregoing, a heat treatment is performed after depositing the anti-reaction layer 80 to fill the grain boundaries of the anti-reaction layer 80 with oxygen atoms. This point is essentially the same with that of the second embodiment. Thus, the penetration of aluminum atoms from the connection can be interfered by the anti-reaction layer 80.

The ohmic characteristics can be ameliorated by forming a titanium silicide layer 79 as the ohmic layer on the surface of the semiconductor substrate 71.

In each of the embodiments above, the first and the second anti-reaction layers 16 and 17, or the anti-reaction layer 50 is formed using titanium nitride. However, titanium nitride is not the only material allowed to be used in those layers, and others, such as titanium oxynitride (TiON), can be used as well.

The films above need not be deposited by sputtering alone. For instance, a CVD process and other film deposition processes can be used in the place of sputtering.

The process for fabricating the aforementioned connection structure is applicable also to connection structures of semiconductor devices such as MOS devices, bipolar devices, and CCDs (charge-coupled devices).

As described in detail in the foregoing, the present invention provides a process which comprises forming a first anti-reaction layer by temporarily ceasing the deposition, and then initiating the film deposition again to form a second anti-reaction layer on the surface of the previously deposited first anti-reaction layer. In this manner, the majority of the grain boundaries in the second reaction preventive can be formed without being linearly superposed on the grain boundaries of the first anti-reaction layer. Thus, the penetration of aluminum atoms through the grain boundaries of the anti-reaction layer can be prevented when an aluminum connection is formed. Accordingly, junction leak attributed to the formation of aluminum spikes can be suppressed. Conclusively, the present invention provides connection structures of high reliability.

Furthermore, the grain boundaries in the anti-reaction layer can be buried with oxygen by applying heat treatment after depositing the anti-reaction layer. Thus, the heat treatment also prevents aluminum atoms from penetrating through the grain boundaries.

Since the heat treatment is performed under an inert gas atmosphere containing oxygen or in air, the oxygen can be incorporated more easily into the grain boundaries. Furthermore, the heat treatment is conducted in the temperature range of from 400° to 600° C. to allow oxygen atoms enter the grain boundaries without considerably increasing the contact resistance.

By additionally depositing an ohmic film on the surface of the semiconductor substrate before depositing the anti-reaction layer, the ohmic characteristics can be further improved.

While the invention has been described in detail and with reference to specific embodiments thereof, it will be apparent to one skilled in the art that various changes and modifications can be made therein without departing from the spirit and scope thereof.

What is claimed is:

1. A process for fabricating a connection structure for a semiconductor, wherein the semiconductor provides a contact hole through an insulator film to a semiconductor substrate, having an anti-reaction layer formed on side walls and a bottom of said contact hole, consisting of the steps of:

depositing a first anti-reaction layer onto said semiconductor substrate within said contact hole by using a film deposition process including generating a plasma;

temporarily ceasing the generating of the plasma;

resuming the generating of the plasma again, without changing deposition process conditions to define the first anti-reaction layer having a first pattern of grain boundaries to form a second anti-reaction layer on the surface of the previously deposited first anti-reaction layer having a second pattern of grain boundaries discontinuous from said first pattern; and then subjecting the first and second anti-reaction layers to heat treatment which is performed under an inert gas atmosphere containing oxygen or in air only after the deposition of the second anti-reaction layer.

2. The process according to claim 1, wherein said heat treatment is performed within a temperature range of 400°–600° C.

3. The process according to claim 1, wherein said heat treatment is conducted at 500° C.

* * * * *